US006979489B2

(12) United States Patent
Lu et al.

(10) Patent No.: US 6,979,489 B2
(45) Date of Patent: Dec. 27, 2005

(54) ZINC OXIDE NANOTIP AND FABRICATING METHOD THEREOF

(75) Inventors: Yicheng Lu, East Brunswick, NJ (US); Sriram Muthukumar, Highland Park, NJ (US); Nuri William Emanetoglu, Woodbury, NJ (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 85 days.

(21) Appl. No.: 10/243,269

(22) Filed: Sep. 13, 2002

(65) Prior Publication Data

US 2003/0213428 A1 Nov. 20, 2003

Related U.S. Application Data

(60) Provisional application No. 60/380,270, filed on May 15, 2002.

(51) Int. Cl.[7] .......................... B32B 15/00; B32B 9/04; B32B 3/00
(52) U.S. Cl. .................. 428/209; 428/195.1; 428/446; 428/469; 428/698; 428/701; 428/702; 977/DIG. 1
(58) Field of Search .................. 428/446, 698, 428/469, 701, 702, 195.1; 429/209; 977/DIG. 1

(56) References Cited

U.S. PATENT DOCUMENTS

| 5,728,215 | A | 3/1998 | Itagaki et al. |
| 6,210,800 | B1 * | 4/2001 | Nesper et al. ............. 428/367 |
| 6,231,744 | B1 | 5/2001 | Ying et al. |
| 6,342,277 | B1 | 1/2002 | Sherman |
| 6,420,279 | B1 | 7/2002 | Ono et al. |
| 6,882,051 | B2 * | 4/2005 | Majumdar et al. .......... 257/746 |
| 2002/0084502 | A1 | 7/2002 | Jang et al. |
| 2002/0175408 | A1 * | 11/2002 | Majumdar et al. .......... 257/734 |
| 2003/0126742 | A1 * | 7/2003 | Ting et al. .................... 29/874 |

OTHER PUBLICATIONS

Huang et al., "Room-Temperature Ultraviolet Nanowire Nanolasers", Science 2001, vol. 292, pp1897-1899.*
Huang et al., " Catalytic Growth of Zinc Oxide Nanowires by Vapor Transport", Advanced Materials, 2001, 13 No. 2, pp. 113-116.*
Cheng, et al. "Large-scale synthesis of single crystalline gallium nitride nanowires" Applied Physics Letters; vol. 75, No. 16. Oct. 18, 1999.

(Continued)

Primary Examiner—Stephen Stein
(74) Attorney, Agent, or Firm—Hoffmann & Baron, LLP

(57) ABSTRACT

In the present invention, there are provided self-assembled ZnO nanotips grown on relatively low temperatures on various substrates by metalorganic chemical vapor deposition (MOCVD). The ZnO nanotips are made at relatively low temperatures, giving ZnO a unique advantage over other wide bandgap semiconductors such as GaN and SiC. The nanotips have controlled uniform size, distribution and orientation. These ZnO nanotips are of single crystal quality, show n-type conductivity and have good optical properties. Selective growth of ZnO nanotips also has been realized on patterned (100) silicon on r-sapphire (SOS), and amorphous $SiO_2$ on r-sapphire substrates. Self-assembled ZnO nanotips can also be selectively grown on patterned layers or islands made of a semiconductor, an insulator or a metal deposited on R-plane (01$\bar{1}$2) $Al_2O_3$ substrates as long as the ZnO grows in a columnar stucture along the c-axis [0001] of ZnO on these materials. Such self-assembled ZnO nanotips and nanotip arrays are promising for applications in field emission displays and electron emission sources, photonic bandgap devices, near-field microscopy, UV optoelectronics, and bio-chemical sensors.

27 Claims, 9 Drawing Sheets

OTHER PUBLICATIONS

Gorla, et al. "Structural, optical and surface acoustic wave properties of epitaxial ZnO films grown on (01$\bar{1}$2) sapphire by metalorganic chemical vapor deposition" Journal of Applied Physics; vol. 85, No. 5. Mar. 1, 1999.

Johnson, et al. "Single Nanowire Lasers" The Journal of Physical Chemistry; vol. 105, No. 46. Nov. 22, 2001.

Khalfallah, et al. "Wet-etching fabrication of multilayer GaAlAs/GaAs microtips for scanning near-field optical microscopy" Applied Physics A. Jun. 30, 2000.

Li, et al. "Synthesis of aligned gallium nitride nanowire quasi-arrays" Applied Physics A. Aug. 9, 2000.

Look, et al. "Production and annealing of electron irradiation damage in ZnO" Applied Physics Letters; vol. 75, No. 6. Aug. 9, 1999.

Muthukumar, et al. "Control of morphology and orientation of ZnO thin films grown on $SiO_2$/Si substrates" Journal of Crystal Growth 225 (2001) 197-201.

Muthukumar, et al. "Two-step metalorganic chemical vapor deposition growth of piezoelectric ZnO thin films on $SiO_2$/Si substrate" J. Vac. Sci. Technol. A 19(4), Jul./Aug. 2001.

Poborchii, et al. "Optical properties of arrays of Si nanopillars on the (1 0 0) surface of crystalline Si" Physica E 7 (2000) 545-549.

Wong, et al. "Field-emission characteristics of SiC nanowires prepared by chemical vapor deposition" Applied Physics Letters; vol. 75, No. 19. Nov. 8, 1999.

* cited by examiner the nanotips is along the c-axis

ZINC OXIDE NANOTIP AND FABRICATING METHOD THEREOF

CROSS REFERENCE TO RELATED APPLICATIONS

This application claims priority to Provisional Application Serial No. 60/380,270 filed on May 15, 2002 and entitled "Selective Growth and Fabrication of ZnO Single Nanotip and Nanotip Arrays".

This invention was made with Government support under Grant No. NSF-CCR 0103096, awarded by the National Science Foundation. Therefore, the United States Government has certain rights in this invention.

FIELD OF THE INVENTION

This invention relates to growth and applications of zinc oxide nanotips and to a method of fabrication thereof, and more particularly to the selective growth of zinc oxide nanotips on various substrates and having potential applications in areas such as field emission devices (FEDs), photonic bandgap devices, near-field microscopy, ultraviolet photonics and lasers, biological agent detectors and instrumentation.

BACKGROUND OF THE INVENTION

Currently, nanotips are of strong interest for applications such as field emission and near-field microscopy. Nano- and microtips have been demonstrated in Si using anisotropic wet chemical etching (see V. V. Poborchii, T. Tada, T. Kanayama, "Optical properties of arrays of Si nanopillars on the (100) surface of crystalline Si", *Physica E*, 7, 545, 2000). A nanotip $Al_xGa_{1-x}As$/GaAs VCSEL, integrated with a photodetector, has also been demonstrated for near-field microscopy (see S. Khalfallah, C. Gorecki, J. Podlecku, M. Nishioka, H. Kawakatsu, Y. Arakawa, "Wet-etching fabrication of multilayer GaAlAs/GaAs microtips for scanning near-field microscopy", *Appl. Phys. A Materials Science and Processing*, electronic publication, Springer-Verlag, Jun. 30, 2000). In traditional micro-tip field-emission devices, the wearing out of the tip due to radiation damage is a major reliability issue. Therefore, a wide bandgap semiconductor material would be preferred for field-emission. There have been reports on SiC nanowires by K. W. Wong et al. (see K. W. Wong, "Field-emission characteristics of SiC nanowires prepared by chemical-vapor deposition", *Appl. Phys. Lett.*, 75 (19), 2918, Nov. 8, 1999), and on GaN nanowires by Li et al. and Cheng et al. (see "Synthesis of aligned gallium nitride nanowire quasi-arrays", *Appl. Phys. A. Materials Science and Processing*, electronic publication, Springer-Verlay, Aug. 9, 2000; G. S. Cheng, L. D. Zhang, Y. Zhu, G. T. Fei, L. Li, C. M. Mo, Y. Q. Mao, "Large-scale synthesis of single crystalline gallium nitride nanowires", *Appl. Phys. Lett.*, 75 (16), 2455, Oct. 18, 1999). However, such nanowires show random orientation and dimensions. For practical device applications, it is desired to have a highly oriented nanotip array that is built on a patterned area. Recently, there have been a few reports on the fabrication of self-assembled ZnO nanowire lasers (see J. C. Johnson, H. Yan, R. D. Schaller, L. H. Haber, R. J. Saykally, P. Yang, "Single nanowire lasers", *J. Physical Chemistry B*, 105 (46), November 2001). ZnO is a wide bandgap semiconductor with a high excitonic binding energy (60 meV), hence can facilitate low-threshold stimulated emission at room temperature. This low-threshold is further enhanced in low-dimensional compound semiconductors due to carrier confinement. ZnO is found to be significantly more radiation hard than Si, GaAs, and GaN. Nanowires of ZnO, Si, SiC, and GaN have been grown using various methods such as vaporphase transport process as disclosed by J. C. Johnson et al (see J. C. Johnson, H. Yan, R. D. Schaller, L. H. Haber, R. J. Saykally, P. Yang, "Single nanowire lasers", *J. Physical Chemistry B*, 105 (46), November 2001), chemical vapor deposition as shown by K. W. Wong et al (see K. W. Wong, "Field-emission characteristics of SiC nanowires prepared by chemical-vapor deposition", *Appl. Phys. Lett.*, 75 (19), 2918, Nov. 8, 1999), direct gas reaction as disclosed by Li et al (see "Synthesis of aligned gallium nitride nanowire quasi-arrays", *Appl. Phys. A. Materials Science and Processing*, electronic publication, Springer-Verlay, Aug. 9, 2000; G. S. Cheng, L. D. Zhang, Y. Zhu, G. T. Fei, L. Li, C. M. Mo, Y. Q. Mao, "Large-scale synthesis of single crystalline gallium nitride nanowires", *Appl. Phys. Lett.*, 75 (16), 2455, Oct. 18, 1999), etc. In these methods, the growth temperatures were in very high range of 900° C. and above. This invention relates to a growth method to grow ZnO nanotips overcoming the deficiencies of prior methods.

SUMMARY OF THE INVENTION

The present invention provides growth of single crystal ZnO nanotip and a regular array of ZnO nanotips on various substrates and a method of selective growth of ZnO nanotips through substrate engineering wherein a said patterned layer of material is deposited on said specific surface plane of the substrate. The substrates and plane orientation that favor growth of ZnO nanotips is provided. A patterned layer of material which could either be a semiconductor, insulator or metal is deposited on said substrate wherein a ZnO columnar structure with the c-axis of ZnO perpendicular to the surface plane of said layer of material to form ZnO nanotips and nanotip arrays, while a smooth and uniform ZnO film grows on the surface plane of the substrate.

BRIEF DESCRIPTION OF THE DRAWINGS

FIG. 4a is a transmission electron microscope (TEM) image of a single ZnO nanotip grown on (100) Silicon.

FIG. 4b is an electron diffraction image obtained from the TEM image of FIG. 4a.

BRIEF DESCRIPTION OF THE INVENTION

Figure 1:
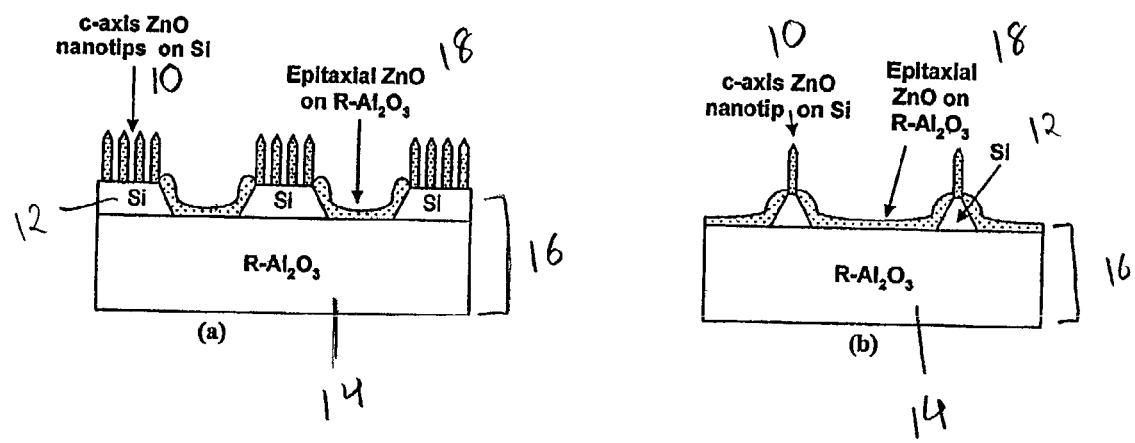
FIG. 1 shows a schematic design of selective growth of ZnO nanotips grown on SOS (silicon on R-plane sapphire) substrates.

ZnO is a wide bandgap semiconductor having a direct bandgap of 3.32 eV at room temperature and can be made piezoelectric, ferroelectric, ferromagnetic and transparent conducting through proper doping. It is a promising candidate material for ultraviolet LED and Laser. ZnO has an exciton binding energy of 60 meV. It is found to be significantly more radiation hard than Si, GaAs, and GaN, which is critical against wearing out during field emission. ZnO is a radiation-hard material and therefore the nanotips have a longer lifetime against wearout due to intense electric field effect. The ZnO nanotips can be grown at relatively low temperatures, giving ZnO a unique advantage over other wide bandgap semiconductors, such as GaN and SiC.

The present invention is generally based on growth of ZnO single nanotips and nanotip arrays on various substrates which could be a semiconductor such as but not limited to Si or GaN, an insulator such as but not limited to $SiO_2$ or $Al_2O_3$, and a metal such as but not limited to Al or Ag, by metalorganic chemical vapor deposition (MOCVD). The ZnO nanotips are single crystalline, n-type conductive and show good structural and optical properties. The size of the nanotips range from 25 nm to 60 nm at the base. The room temperature PL peak is very intense and sharp with a FWHM of ~120 meV.

A-plane ($11\bar{2}0$) ZnO grows epitaxially on R-plane ($01\bar{1}2$) sapphire substrate. In this orientation the c-axis, which is the principal symmetrical axis in wurtzite structures, lies in the plane of the substrate. The epitaxial relationship of ZnO on R-plane sapphire is ($11\bar{2}0$) ZnO ||($01\bar{1}2$) $Al_2O_3$ and [0001] ZnO||[$01\bar{1}1$] $Al_2O_3$. The growth along the [$11\bar{2}0$] direction is slower than that along the [0001] direction. However, when ZnO grows on various other substrate materials such as Si, $SiO_2$, C—$Al_2O_3$, A—$Al_2O_3$, GaN, Al, and Ag, due to the high growth rate along the c-axis of ZnO, the ZnO grows as columns. In these substrates except GaN the lattice mismatch with ZnO is very high. The epitaxial relationship between ZnO and C-plane sapphire is (0001) ZnO||(0001) $Al_2O_3$ and ($10\bar{1}0$) ZnO||($2\bar{1}\bar{1}1$) $Al_2O_3$, while the epitaxial relationship between ZnO and A-plane sapphire is (0001) ZnO||($11\bar{2}0$) $Al_2O_3$ and ($11\bar{2}0$) ZnO||(0001) $Al_2O_3$. Therefore, ZnO on these substrates grows with the c-axis perpendicular to the plane. Very dense and smooth films of ZnO have been grown on various orientations of sapphire and GaN. Under certain growth conditions involving high nucleation vs growth mechanisms columnar ZnO growth can be obtained on these substrates. Columnar ZnO growth also occurs on amorphous $SiO_2$ and on glass substrates. On GaN, though the lattice mismatch is small columnar growth can still be obtained for film deposition in high nucleation vs growth conditions. ZnO is a polar semiconductor with the (0002) planes being Zn-terminated and the ($000\bar{2}$) planes being O-terminated. These two crystallographic planes have opposite polarity and hence have different surface relaxations energies. This leads to a higher growth rate along the c-axis. Therefore, the ZnO film grown on many semiconducting, insulating or metallic substrates have a preferred c-axis orientation normal to the surface. Therefore, ZnO growth results in a smooth epitaxial film on R-plane sapphire substrates and results in a pillar like structure on these semiconducting, insulating, and metallic substrates.

Selective growth of ZnO nanotips can be obtained through substrate engineering wherein a patterned layer of material is deposited on a substrate. A ZnO film grows on said material to form ZnO nanotips and nanotip arrays, while a smooth and uniform ZnO film grows on the substrate. One method for selective growth of ZnO nanotips on R—$Al_2O_3$ is to use a template layer formed by a patterned $SiO_2$ layer. The $SiO_2$ layer is deposited on R—$Al_2O_3$ substrates for selective growth. The c-axis oriented ZnO nanotips would grow on the $SiO_2$ islands while an epitaxial ($11\bar{2}0$) ZnO film, much thinner than the height of the nanotips would grow on the exposed R—$Al_2O_3$ surface. To selectively grow a single ZnO nanotip, the surface area of the patterned $SiO_2$ island should be limited to the size of the base of the ZnO nanotip (~100 nm×100 nm or less). Thus the growth in the horizontal directions will be a self-limiting process.

Referring to FIG. 1, there is shown another method for selective growth of ZnO nanotips 10 using silicon (Si) 12 on R-plane sapphire ($Al_2O_3$) 14, substrate (SOS) 16 for fabricating the template, which is especially suitable for single ZnO nanotip growth.

On the SOS (silicon on R-plane sapphire) substrate 16, the Si 12 epitaxial layer will be patterned into islands for the subsequent ZnO nanotip array 10 growth. Various etching and depositing methods can be used to pattern the Si 12 islands on R-plane $Al_2O_3$ 14. During ZnO growth a thin $SiO_2$ layer (not shown) will initially form on the Si 12 surface, then c-axis oriented ZnO will grow on this $SiO_2$/Si structure to form a ZnO nanotip and nanotip array 10, while on R-plane $Al_2O_3$ 14 ZnO 18 growth will be smooth and epitaxial with the ZnO c-axis lying in the plane of the substrate. This is shown schematically in FIG. 1(a). Growth of a single nanotip 10 on a Si 12 island on R-plane $Al_2O_3$ substrate 14 is also possible. For this purpose, the Si 12 islands will be formed by anisotropic etching such that only a 100 nm×100 nm or less Si 12 surface is available for ZnO growth. This is schematically shown in FIG. 1(b). Thus, selective growth of ZnO nanotips and nanotip arrays can be achieved by substrate engineering.

The substrate patterning of Si or $SiO_2$ islands can also be achieved by direct deposition on R-plane ($01\bar{1}2$) sapphire using various techniques other than etching techniques, such as but not limited to imprinting, solid free form fabrication, etc. In such cases ZnO nanotips can be selectively grown on the patterned Si or $SiO_2$ islands formed on R-plane ($01\bar{1}2$) $Al_2O_3$ substrates.

The selective growth of ZnO nanotips and nanotip array can also be obtained on any patterned layers or islands made of a semiconducting, an insulating or a metallic material deposited on substrates which have a orientation relationship with ZnO such that the primary symmetrical axis i.e. c-axis of ZnO lies on the growth plane of the substrate and ZnO grows with the c-axis [0001] perpendicular to the surface plane on the patterned layers or islands.

ZnO nanotip growth was carried out in a vertical flow MOCVD reactor. Diethylzinc (DEZn) and oxygen were used as the Zn metalorganic source and oxidizer, respectively. Film deposition was carried out at a substrate temperature preferably in the range of 300° C.–500° C. X-ray diffraction measurements were carried out using a Bruker D8 Discover diffractometer using Cu K$\alpha_1$ ($\lambda$=1.5406 Å) with an angular resolution of 0.005°. Leo-Zeiss field emission scanning electron microscope (FESEM) was used to characterize the morphology of the films and a Topcon 002B transmission electron microscope was used to do detailed structural characterizations. The room temperature photoluminescence (PL) spectrum was conducted using a 325 nm CW He—Cd laser as the excitation source. The wavelength resolution is 0.5 nm.

Figure 2:
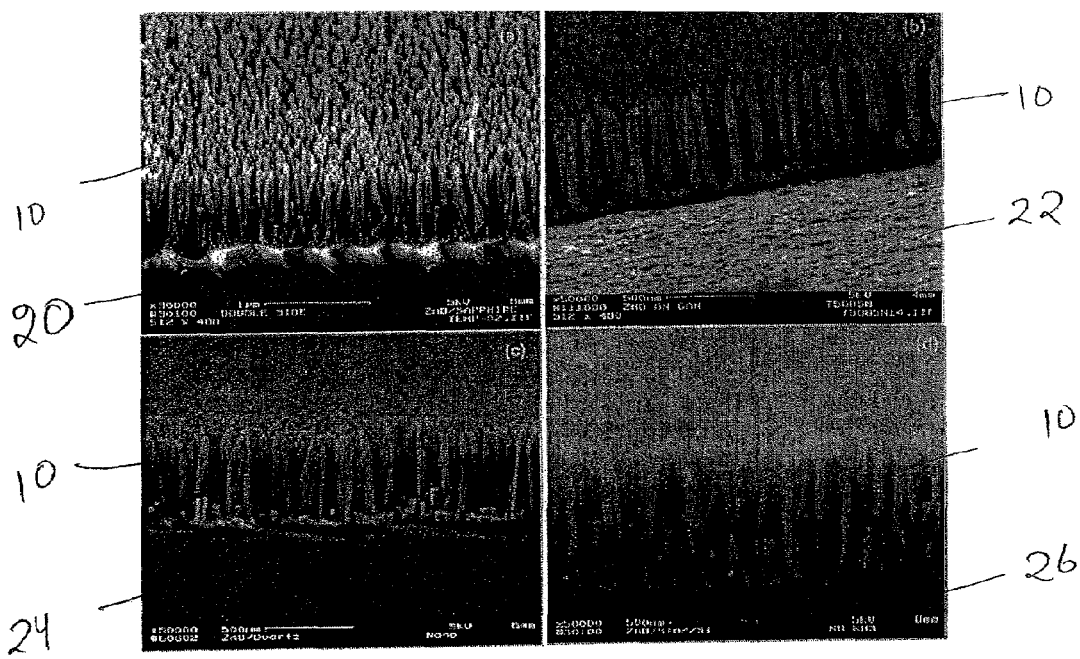
FIG. 2 is a field-emission scanning electron microscope image showing nanocolumnar growth of ZnO on various substrates (a) C—$Al_2O_3$, (b) epitaxial c-GaN, (c) fused Silica, and (d) thermally grown $SiO_2$/Si according to the present invention.

Referring to FIG. 2, in an embodiment of the present invention there is shown a cross-section field-emission scanning electron microscope image of ZnO nanotips 10 grown on various substrates by MOCVD. The various substrates include c-plane $Al_2O_3$ 20 as shown in FIG. 2(a), epitaxial c-GaN 22, see FIG. 2(b), fused silica 24 as shown in FIG. 2(c) and thermally grown $SiO_2$/Si 26, see FIG. 2(d). It is noted that the growth conditions were basically the same for all the substrates. ZnO on these substrates grows with the c-axis perpendicular to the plane of the surface. Very dense and smooth epitaxial films of ZnO have been grown on various orientations of sapphire and GaN. However, under certain growth conditions columnar growth can be obtained on these substrates. Alternatively, when ZnO grows on fused silica 24 or on amorphous $SiO_2$ thermally grown on (100) Si, i.e., $SiO_2$/Si 26, it forms the columnar structure. Hence, the growth of the ZnO nanotips can be achieved as long as the c-axis of ZnO grows perpendicular to the substrate in consideration.

Figure 3A:
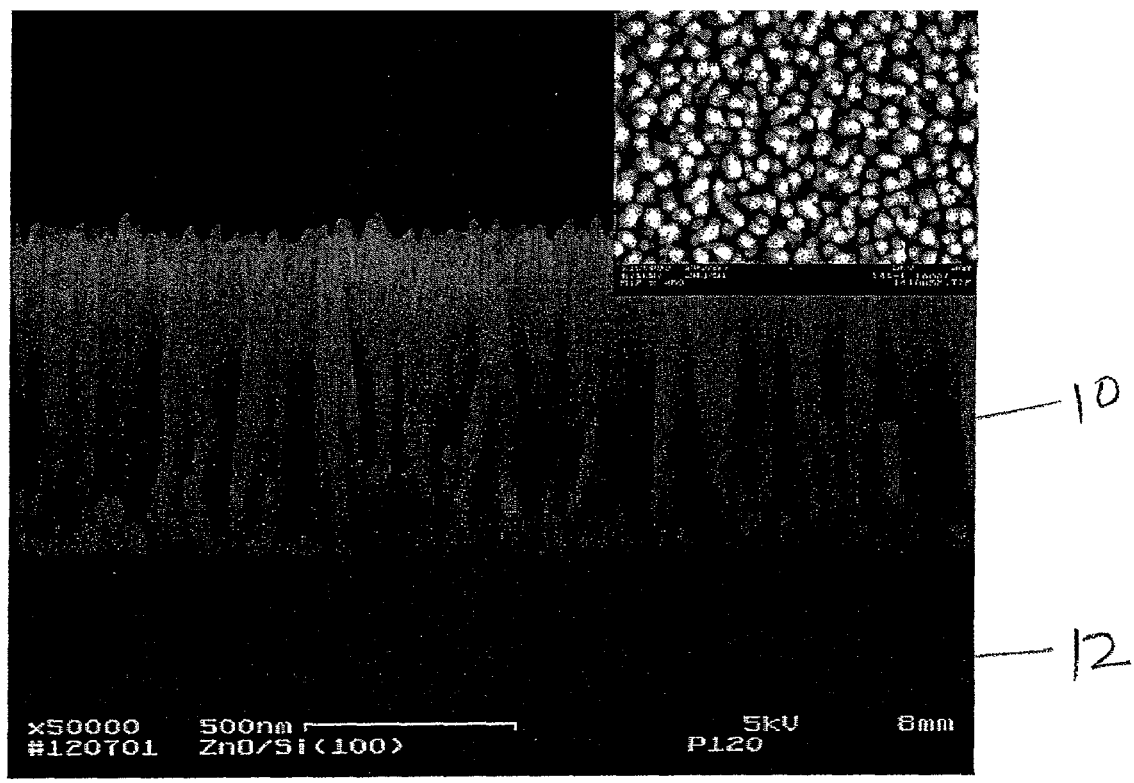
FIG. 3a is a field-emission scanning electron microscope image of ZnO nanotips on (100) Silicon substrate used in the present invention.
Figure 3B:
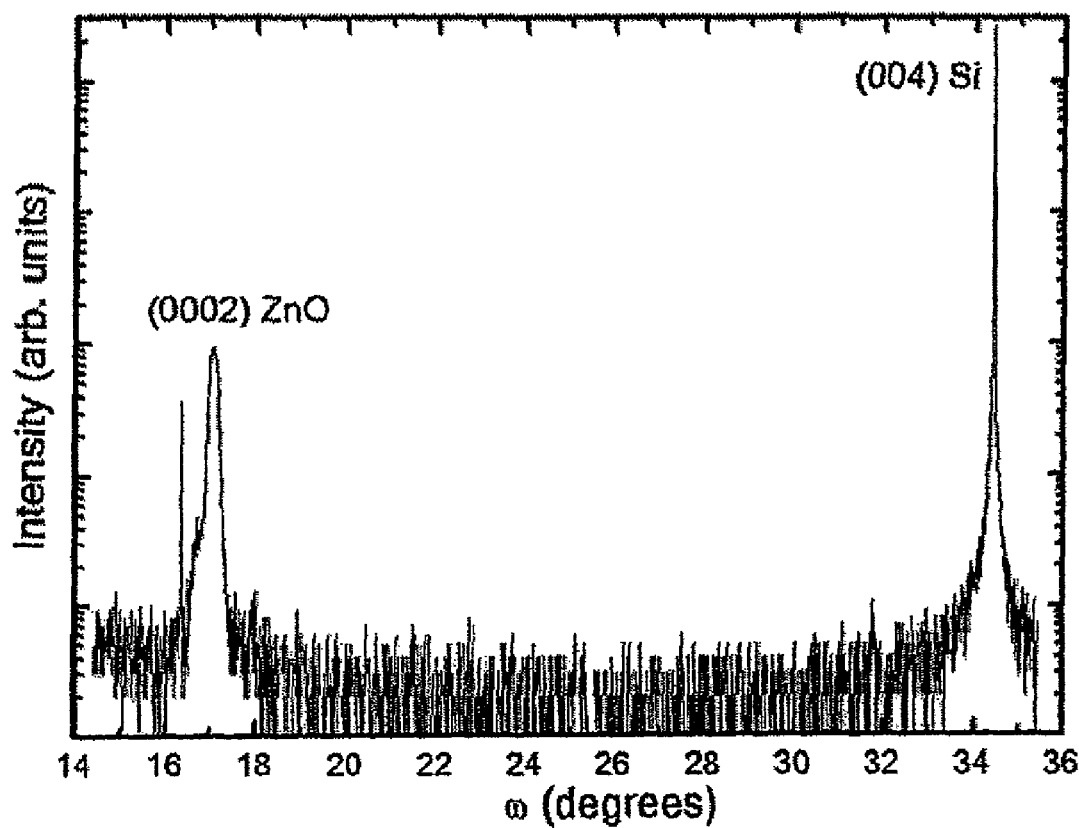
FIG. 3b shows an x-ray diffraction plot of ZnO nanotips grown on (100) Silicon substrate. The nanotips are all aligned along the c-axis of the ZnO.
Figure 4:
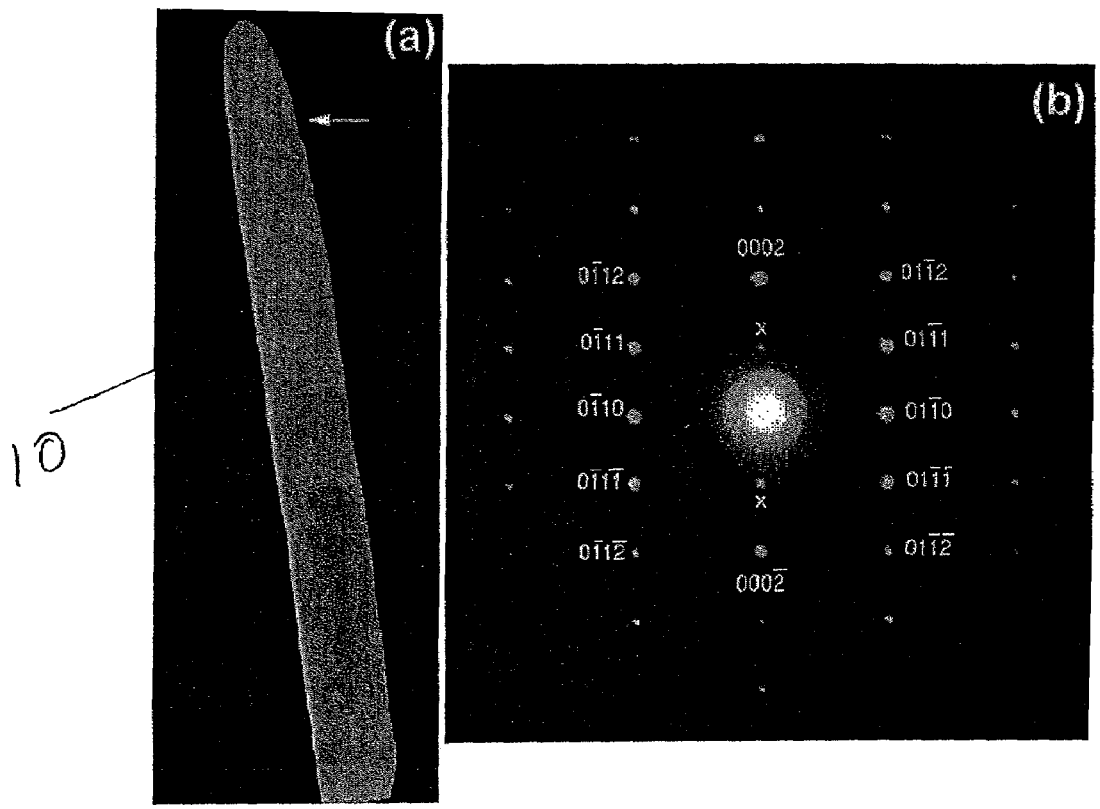

ZnO nanotip 10 growth is also observed on (100) Si 12 as shown in FIG. 3a. In this case, i.e. the ZnO columnar growth on Si substrate, the ZnO nanotips 10 are all preferably oriented along the c-axis and have a base diameter of ~40 nm and terminate with a very sharp nanoscale tip. The crystalline orientation of the ZnO nanotips 10 was determined using XRD measurements as shown in FIG. 3b. FIG. 4a illustrates a dark field transmission electron microscopy (TEM) image of a single ZnO nanotip 10 grown on (100) Si 12 and FIG. 4b is an electron diffraction image obtained therefrom. The image obtained is a single ZnO nanotip 10 aligned to the ($2\bar{1}\bar{1}0$) zone axis. The spots marked by x in FIG. 4b are those due to forbidden reflections. Defects in single crystal materials are better characterized in dark field imaging mode. The dark field TEM image of a single ZnO nanotip 10 shows very few defects. The indexed diffraction pattern further confirms the single crystal quality of the ZnO nanotips 10.

Figure 5:
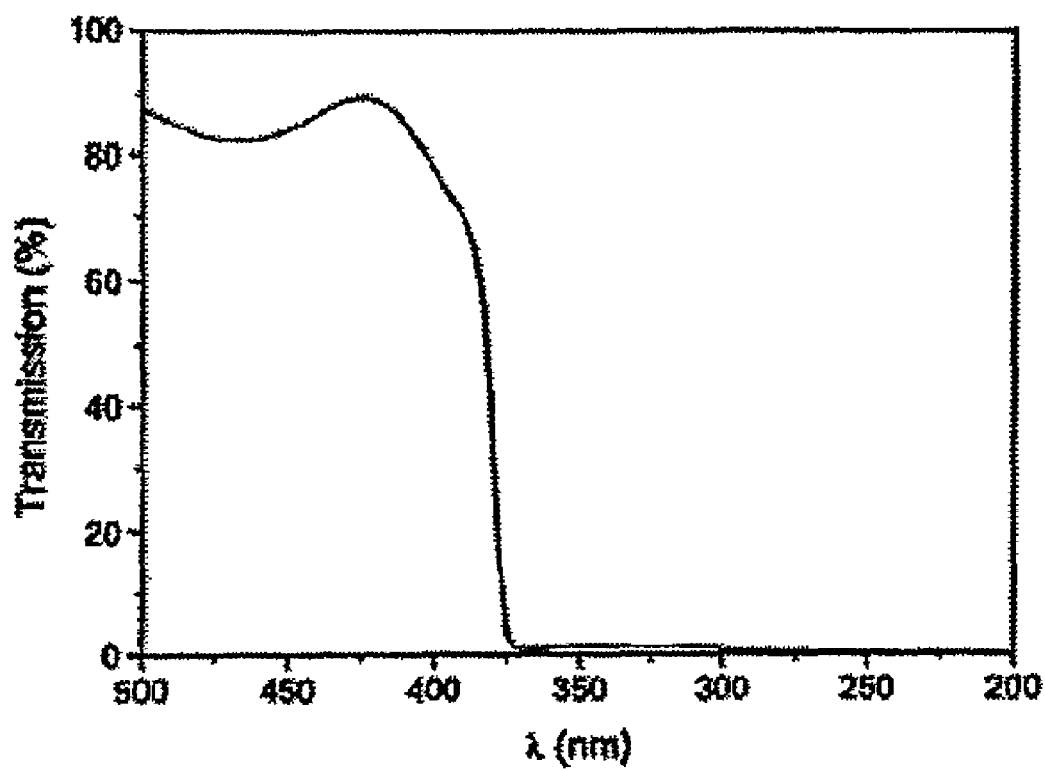
FIG. 5 shows a plot of a transmission spectra as a function of wavelength of ZnO nanotips grown on silica substrate.

FIG. 5 shows the optical transmission spectrum of ZnO nanotips 10 grown on fused silica substrate 24, measured at room temperature by a UV-Visible spectrophotometer. The transmission spectrum indicates that the cutoff wavelength of ZnO nanotips is around 370 nm, which is the intrinsic optical absorption edge of ZnO, confirming that the ZnO nanotip 10 is a wide bandgap semiconductor material. It can also be seen that the transmission over 82% is achieved in the transparency region with a sharp absorption edge illustrating good quality of the nanotips. The fringes in the transparency region of the spectrum are mainly due to the interference effect.

Figure 6:
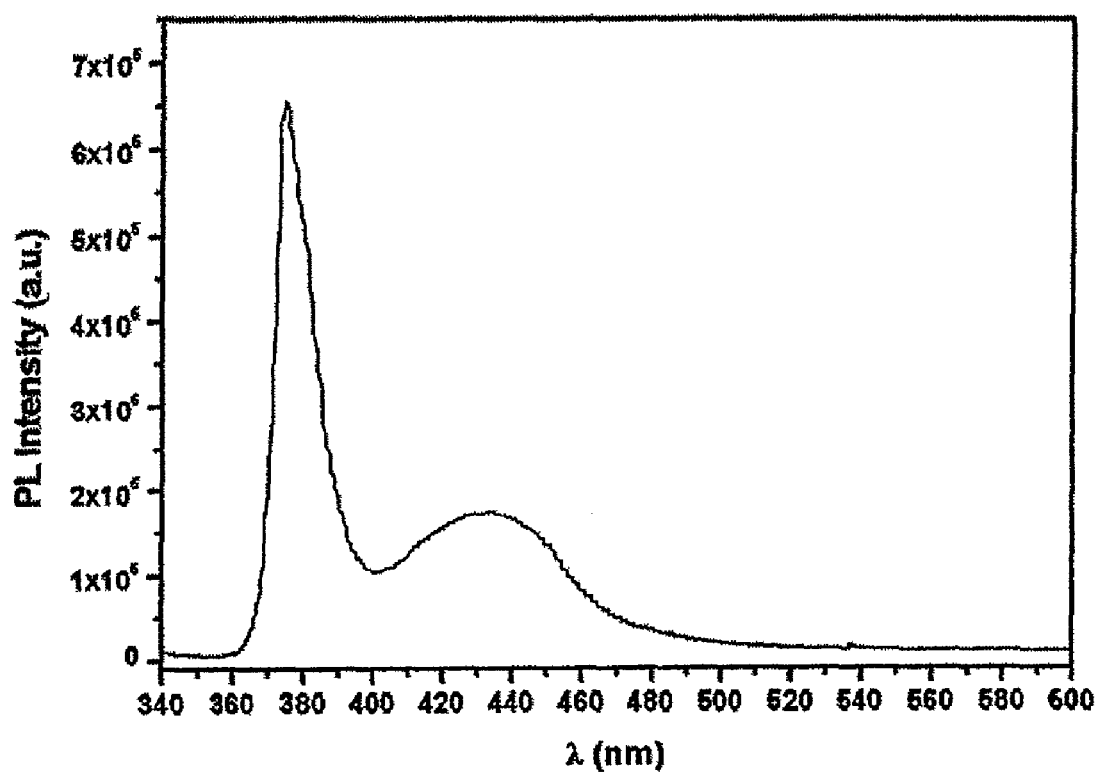
FIG. 6 shows a plot of photoluminescence spectra of ZnO nanotips grown on $SiO_2$/R-sapphire.

FIG. 6 shows the room temperature photoluminescence (PL) spectrum of ZnO nanotips 10 grown on $SiO_2$ deposited on R-plane ($01\bar{1}2$) sapphire 14. The amorphous $SiO_2$ layer (not shown) was deposited on the r-sapphire substrate 14 using PECVD. A strong PL peak is observed at 3.32 eV (373.5 nm), whose intensity is ten times stronger than those obtained on ZnO epilayers. This peak results from the free-exciton recombination that is prominent in ZnO nanotips 10. The full width at half maximum (FWHM) of PL is measured to be 120 meV (~13 nm) for the ZnO nanotips 10 grown over an amorphous $SiO_2$ layer on r-plane sapphire 14. The intense and sharp intrinsic PL emission peak confirms the good optical property of the ZnO nanotips 10. It also complements the structural analysis from the TEM measurement that the ZnO nanotips 10 are of single crystal quality. A weaker emission peak around 2.8 eV is also observed.

Figure 7:
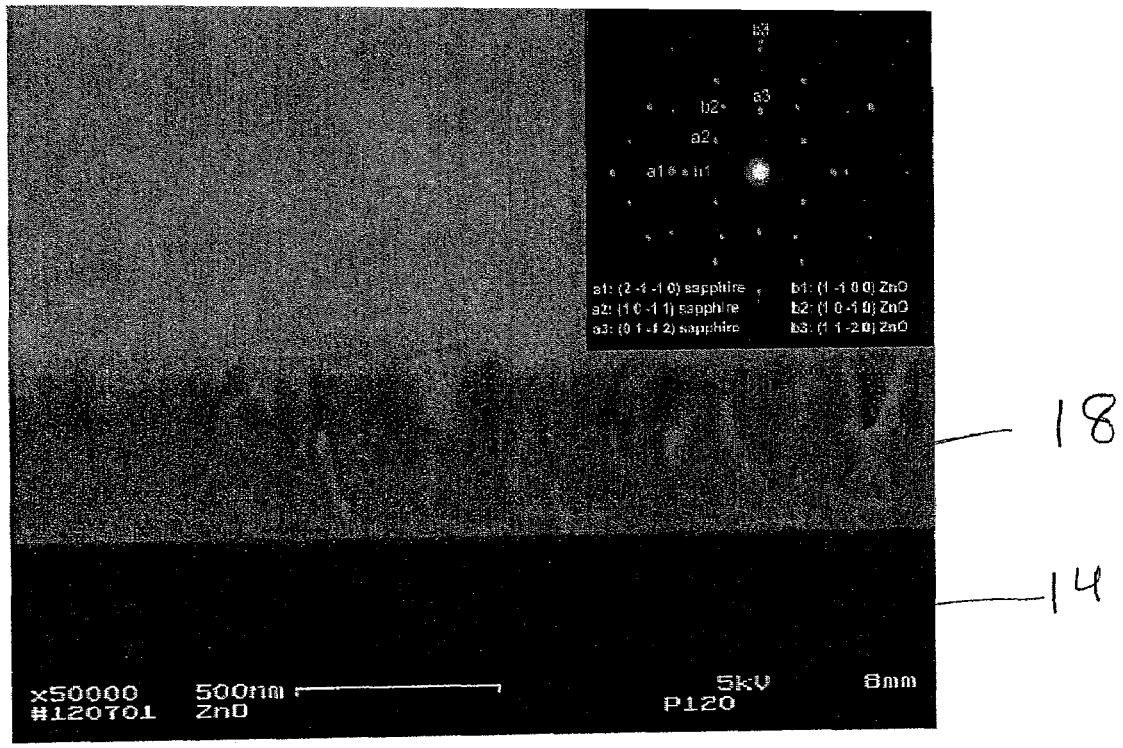
FIG. 7 is a field-emission scanning electron microscope image showing an epitaxial ZnO film grown on R—$Al_2O_3$ using MOCVD according to the present invention. The growth conditions were same as that for ZnO grown on other substrates shown in FIG. 2.

In contrast to the columnar growth, the ZnO film 18 grown on R-plane ($01\bar{1}2$) sapphire 14 under the same growth conditions results in a smooth film with flat morphology. FIG. 7 is a FESEM image of a ZnO film 18 grown on R-plane $Al_2O_3$ 14. The ZnO film shows a flat surface with the epitaxial relationship ($11\bar{2}0$) ZnO∥($01\bar{1}2$) $Al_2O_3$, and [0001] ZnO∥[$0\bar{1}11$] $Al_2O_3$. Hence, the c-axis of ZnO is parallel to the plane of the substrate. This is different from the ZnO films grown on C-plane sapphire $Al_2O_3$ 20 and A-plane sapphire $Al_2O_3$ (not shown) substrates wherein the c-axis of ZnO is perpendicular to the substrate plane. The FWHM ω-rocking curve was measured to be 0.25° for the ZnO film 18 grown on R-plane $Al_2O_3$ 14 using metalorganic chemical vapor deposition (MOCVD).

Figure 8:
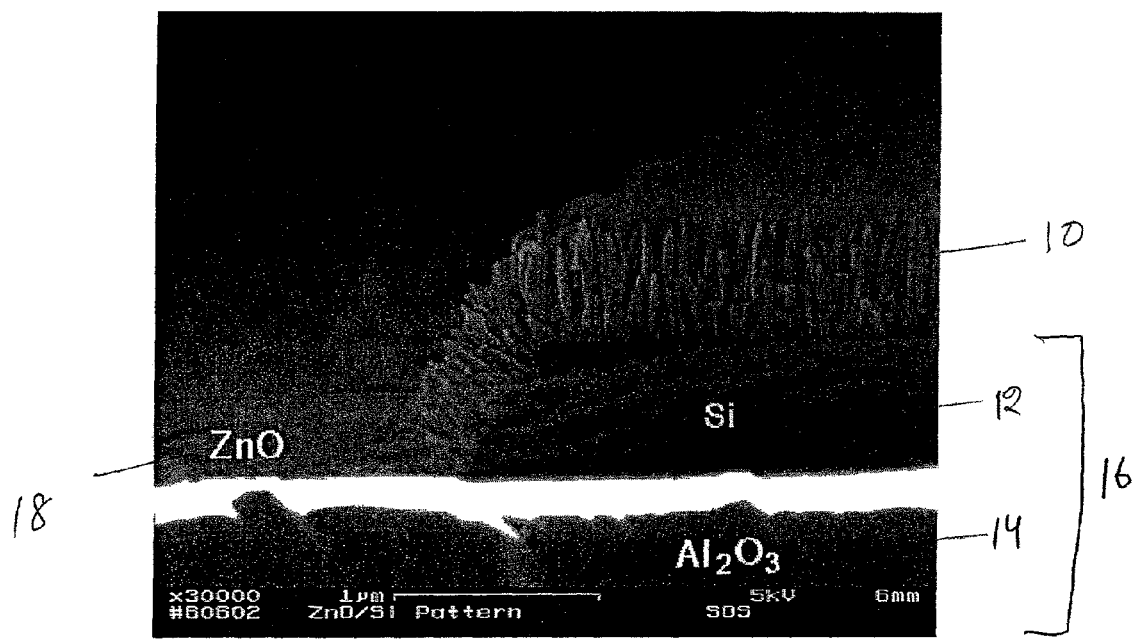
FIG. 8 is a field-emission scanning electron microscope image of selective growth of ZnO nanotips on patterned silicon-on-sapphire substrate according to the present invention.

The significant difference in the growth rate of ZnO film 18 on R-plane ($01\bar{1}2$) sapphire substrates 14 and silicon 12 or $SiO_2$ has been used to obtain selective growth of ZnO nanotips 10 on patterned silicon-on-sapphire (SOS) substrates 16. The patterning of the SOS substrates 16 was realized by first depositing a thin $SiO_2$ film on the SOS substrate 16 using LPCVD, which serves as a mask for etching the silicon film. Then, a KOH solution and buffered oxide etchant (BOE) were used to selectively etch silicon and $SiO_2$, respectively. FIG. 8 shows a ZnO 18 grown on patterned SOS substrate 16. The ZnO nanotips 10 are only observed on the exposed Si 12 (100) top surface and the sidewall (111) surface as KOH anisotropically etches (100) Si 12 producing sidewalls oriented along the <111> direction. The growth of ZnO nanotips 10 on the sidewalls of the silicon Si 12, islands can be avoided by using dry etching methods that give a vertical etching profile. Similar selective growth was also obtained for patterned amorphous S102 (not shown) deposited on r-plane sapphire substrates 14. The as-grown ZnO nanotips 10 using MOCVD show n-type conductivity. The resistivity of the ZnO epilayer grown on the sapphire of the SOS substrate was measured using four point probe method. A resistivity of 3.4 Ωcm was obtained for the ZnO epilayer. The carrier concentration was evaluated to be $7.3 \times 10^{16}$ $cm^{-3}$ correspondingly.

As mentioned above, ZnO nanotips and nanotip arrays can be applied in several major device applications. Some of these applications are briefly discussed below.

One such application is in field-emission devices. The field emission can be achieved and enhanced due to the high electric field existing on the sharp tips of the ZnO nanostructures. Furthermore, as a wide bandgap semiconductor ZnO is also radiation-hard and prolongs the lifetime of the nanotips against wearing out resulting from radiation damage. The field emission from ZnO nanotip arrays can be applied for novel field emission display technology as well as for the new electron emission source of many electron-beam instruments.

Another application is in the field of photonic bandgap devices (PBG). Photonic crystals offer the possibility of controlling and manipulating light through the presence of photonic bandgap. The ability to control the propagation of electromagnetic waves within the photonic bandgap makes it useful for broad applications, such as semiconductor laser mode control, thresholdless light-emitting diodes, filters, and polarizers in two-dimensional waveguides in integrated optics, etc. The refractive index of ZnO $n_{ZnO}$ is 2.79 (⊥ c-axis). ZnO single crystal nanotip arrays have lower optical loss, than Si and other currently available nanotips; hence ZnO nanotips are promising material candidate for fabricating two-dimensional (2D) photonic crystals.

ZnO has a direct and wide bandgap with a high excitonic binding energy (60 meV), which facilitate low-threshold stimulated emission at room temperature. This low-threshold is further enhanced in low-dimensional compound semiconductors such as ZnO nanoscale tips due to carrier confinement effect. Optically pumped ZnO UV lasing have been reported. The future direction is to make ZnO based UV lasers, detectors and light emitting diodes for UV optoelectronics. Single crystal ZnO nanotip arrays selectively grown on the patterned substrate are promising for realization of such device applications. In comparison to other published methods of ZnO nanowire growth, this invention is a lower temperature process, and the substrate engineering for selective growth is a more controllable technique.

Individual ZnO nanotips can find many applications, particularly for fine instrumentation such as atomic force microscopy (AFM), scanning tunneling optical microscopy (STOM), near field microscopy (NSOM), scanning probe microscopy (SPM) and microelectromechanical systems (MEMS). As ZnO is a piezoelectric material, with high electromechanical coupling coefficients, a single ZnO nanotip can be used for atomic force microscopy applications. Utilizing ZnO's optical properties, these nanotips can also be used for STOM optical probes. Thus a single ZnO nanotip device can be used for both AFM and STOM modes in a SPM, eliminating the need to change the tips for different measurements.

Finally, ZnO nanotips can also be used to detect DNA and harmful biological agents in the field of biological sensors. One of the key issues for DNA detection is the immobilization. The sharp ZnO nanotips provide the favorable binding sites to enhance the immobilization by providing enhanced effective sensing area, therefore, improve the sensing and detection efficiency. For bio-sensors, the use of ZnO nanotip arrays greatly increases the effective sensing area of the devices.

While the invention has been described in related to the preferred embodiments with several examples, it will be understood by those skilled in the art that various changes may be made without deviating from the fundamental nature and scope of the invention as defined in the appended claims.

What is claimed is:

1. A ZnO nanotip comprising:
   a substrate; and
   a one or more nanotips consisting essentially of single crystalline ZnO formed on said substrate by metalorganic chemical vapor deposition; wherein said substrate has a surface plane orientation and said substrate is selected from the group consisting of semiconductors and insulators.

2. The ZnO nanotip of claim 1 wherein said nanotips form a single crystal columnar structure.

3. The ZnO nanotip of claim 1 wherein the temperature of the substrate is in a range of 300° C.–500° C. during metalorganic chemical vapor deposition.

4. A ZnO nanotip comprising:
   a substrate including a fused silica; and
   one or more of single crystalline ZnO nanotips formed on said substrate by metalorganic chemical vapor deposition.

5. A ZnO nanotip comprising:
   a substrate including a C-plane (0001) GaN; and
   one or more of single crystalline ZnO nanotip formed on said substrate by metalorganic chemical vapor deposition.

6. A ZnO nanotip comprising:
   a substrate including a dual layer structure comprising a first film layer deposited on a solid sate material, wherein said film layer is selected from the group consisting of semiconductors and insulators; and
   one or more single crystalline ZnO nanotips formed on said substrate by metalorganic chemical vapor deposition.

7. The ZnO nanotip of claim 1 wherein said ZnO nanotips have its c-axis perpendicular to the surface plane of the substrate.

8. The ZnO nanotip of claim 3 wherein said semiconductor substrate includes Si, GaN and SiC.

9. The ZnO nanotip of claim 3 wherein said insulator substrate includes a material selected from the group consisting of $SiO_2$, $Al_2O_3$ or a combination thereof.

10. A ZnO nanotip comprising:
    a substrate, wherein the substrate is a metal substrate selected from the group consisting of Al, Ag, Ti, or a combination thereof; and
    one or more of single crystalline ZnO nanotips formed on said substrate by metalorganic chemical vapor deposition.

11. The ZnO nanotip of claim 1 can be used in the field-emission devices.

12. The ZnO nanotip of claim 1 can be used in two-dimensional (2D) photonic bandgap (PBG) devices for controlling and manipulating light.

13. The ZnO nanotip of claim 1 can be used in ultraviolet (UV) optoelectronic devices.

14. The ZnO nanotip of claim 1 can be used for probes in fine instrumentation.

15. The ZnO nanotip of claim 1 can be used for biochemical sensors and DNA sensors.

16. The ZnO nanotip of claim 1 wherein said nanotips comprise an array of nanotips on a patterned substrate.

17. The ZnO nanotip of claim 16, wherein:
    a patterned layer of material is deposited on said substrate to form said patterned substrate, and surface of said patterned layer serves as a base for the ZnO nanotips selectively grown only on the patterned layers;
    a ZnO film selectively grown only on said surface plane of the substrate; and
    said ZnO nanotip selectively grown only on a surface plane of the patterned layers of material to form one or more ZnO nanotips and ZnO arrays.

18. The ZnO nanotip of claim 17 wherein said ZnO film is selectively grown with primary c-axis of the ZnO lying on a growth plane of the substrate.

19. The ZnO nanotip of claim 18 wherein said substrate is an R-plane $Al_2O_3$ and said smooth ZnO epitaxial film is in [11$\bar{2}$0] direction with a c-axis of the ZnO film lying parallel to the R-plane $Al_2O_3$.

20. The ZnO nanotip of claim 17 wherein said ZnO is single crystal columnar structure grown along the c-axis [0001] direction of ZnO.

21. The ZnO nanotip of claim 17 wherein said ZnO nanotips and nanotip array grow in a columnar structure with a c-axis of the ZnO perpendicular to the surface plane of said patterned layer of material.

22. A ZnO nanotip comprising:
a substrate with a patterned layer of material deposited on said substrate, wherein said patterned layer of material is a semiconductor including Si, GaN films or a combination thereof; and
one or more of single crystalline ZnO nanotips selectively grown on a surface plane of the patterned layers of material by metalorganic chemical vapor deposition.

23. A ZnO nanotip comprising:
a substrate with a patterned layer of material deposited on said substrate, wherein said patterned layer of material is an insulator including $SiO_2$, $Al_2O_3$ films or a combination thereof; and
one or more of single crystalline ZnO nanotips selectively grown on a surface plane of the patterned layers of material by metalorganic chemical vapor deposition.

24. A ZnO nanotip comprising:
a substrate with a patterned layer of material deposited on said substrate, wherein said patterned layer of material is a metal including Al, Ag, Ni, Ti films or a combination thereof; and
one or more of single crystalline ZnO nanotips selectively grown on a surface plane of the patterned layers of material by metalorganic chemical vapor deposition.

25. A ZnO nanotip comprising:
a patterned substrate, wherein said patterned substrate comprises silicon-on-sapphire (SOS) wafer; and
one or more of single crystalline nanotips selectively grown on said patterned substrate by metalorganic chemical vapor deposition.

26. The ZnO nanotip of claim 25 wherein the SOS wafer include selectively formed R-plane sapphire pattern and silicon pattern on said SOS substrate.

27. The ZnO nanotip of claim 26 wherein the patterned SOS substrate include a growth of the ZnO epitaxial film on said R-plane sapphire pattern with simultaneous growth of the ZnO nanotip on said silicon pattern, wherein said ZnO film and said ZnO nanotip arrays are selectively formed on same said substrate.

* * * * *